US012665680B2

(12) United States Patent
Kim et al.

(10) Patent No.: US 12,665,680 B2
(45) Date of Patent: Jun. 23, 2026

(54) AMPLIFICATION CIRCUIT, HUMAN BODY CHANNEL-BASED COMMUNICATION SYSTEM INCLUDING THE SAME, AND OPERATION METHOD THEREOF

(71) Applicant: Electronics and Telecommunications Research Institute, Daejeon (KR)

(72) Inventors: Sung Eun Kim, Daejeon (KR); Tae Wook Kang, Daejeon (KR); Hyuk Kim, Daejeon (KR); Kyung Hwan Park, Daejeon (KR); Mi Jeong Park, Daejeon (KR); Hyung-Il Park, Daejeon (KR); Kyung Jin Byun, Daejeon (KR); Kwang Il Oh, Daejeon (KR); Jae-Jin Lee, Daejeon (KR); In Gi Lim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 436 days.

(21) Appl. No.: 18/341,507

(22) Filed: Jun. 26, 2023

(65) Prior Publication Data

US 2024/0097799 A1     Mar. 21, 2024

(30) Foreign Application Priority Data

Sep. 16, 2022   (KR) ........................ 10-2022-0117386
Dec. 2, 2022    (KR) ........................ 10-2022-0166682

(51) Int. Cl.
*H03F 3/19*     (2006.01)
*H04B 13/00*    (2006.01)

(52) U.S. Cl.
CPC ............. *H04B 13/005* (2013.01); *H03F 3/19* (2013.01); *H03F 2200/165* (2013.01); *H03F 2200/171* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 7,545,889 | B2 | 6/2009 | Li et al. |
| 8,054,159 | B2 | 11/2011 | Hyoung et al. |
| 9,545,212 | B2 | 1/2017 | Kim |
| 9,866,332 | B2 | 1/2018 | Oh et al. |
| 11,424,775 | B2 | 8/2022 | Oh et al. |

(Continued)

FOREIGN PATENT DOCUMENTS

| | | |
|---|---|---|
| KR | 10-2007-0061251 | 6/2007 |
| KR | 10-2015-0025109 | 3/2015 |

(Continued)

*Primary Examiner* — Idowu O Osifade
(74) *Attorney, Agent, or Firm* — KILE PARK REED & HOUTTEMAN PLLC

(57) ABSTRACT

Disclosed is an amplification circuit, which includes a first amplifier that receives an external signal and performs first band pass filtering on the external signal to output a first filter signal, and a second amplifier that receives the first filter signal and performs second band pass filtering on the first filter signal to output a second filter signal, and a frequency pass bandwidth of the second band pass filtering is narrower than a frequency pass bandwidth of the first band pass filtering.

18 Claims, 8 Drawing Sheets

(56)                    References Cited

U.S. PATENT DOCUMENTS

| | | | | |
|---|---|---|---|---|
| 2005/0153677 A1* | 7/2005 | Vorenkamp | ........... | H03J 1/0075<br>455/313 |
| 2007/0120605 A1* | 5/2007 | Bult | .................... | H03G 1/0023<br>330/284 |
| 2008/0036037 A1* | 2/2008 | Woo | ................... | H03H 11/1291<br>257/E29.001 |
| 2008/0036536 A1* | 2/2008 | Khorramabadi | ..... | H03B 5/1228<br>330/252 |
| 2011/0067083 A1* | 3/2011 | Vorenkamp | ......... | H01L 23/5227<br>348/731 |
| 2012/0212288 A1* | 8/2012 | Masui | ................ | H03H 11/0427<br>327/557 |
| 2014/0002194 A1* | 1/2014 | Bult | ........................ | H03G 3/30<br>330/254 |
| 2021/0344376 A1* | 11/2021 | Nabki | .................... | H04L 7/033 |

FOREIGN PATENT DOCUMENTS

| | | |
|---|---|---|
| KR | 10-2017-0103069 | 9/2017 |
| KR | 10-2387942 | 4/2022 |

\* cited by examiner

AMPLIFICATION CIRCUIT, HUMAN BODY CHANNEL-BASED COMMUNICATION SYSTEM INCLUDING THE SAME, AND OPERATION METHOD THEREOF

CROSS-REFERENCE TO RELATED APPLICATIONS

This application claims priority under 35 U.S.C. § 119 to Korean Patent Application Nos. 10-2022-0117386 filed on Sep. 16, 2022, and 10-2022-0166682 filed on Dec. 2, 2022, respectively, in the Korean Intellectual Property Office, the disclosures of which are incorporated by reference herein in their entireties.

BACKGROUND

Embodiments of the present disclosure described herein relate to an amplification circuit, and more particularly, relate to an on-chip narrowband amplification circuit, a human body channel-based communication system including the same, and an operation method thereof.

In general, a reception stage of a wireless communication system includes a noise filter and an amplification stage. In the existing communication system, when the reception stage cannot properly receive signals due to noise of various frequencies introduced from the outside during signal transmission, a method of increasing the power of a transmission signal or increasing the transmission efficiency of a transmission signal at the transmission stage may be the most efficient method.

However, when using a method of increasing the power of a transmission signal in a human body channel-based communication system, there is a risk of harming human body safety. In addition, in the human body channel-based communication system, various devices coexist in a small space, and interference and noise between devices may be inferior compared to existing wireless communication systems.

Therefore, in the case of the human body channel-based communication system, it is required to configure a reception stage with low power and a small area, and to secure a narrowband filtering function for removing various noises.

SUMMARY

Embodiments of the present disclosure provide an amplification circuit capable of implementing in a small area and consuming low power by utilizing a multi-stage amplification stage and an input bias circuit, a human body channel-based communication system including the same, and an operation method thereof.

According to an embodiment of the present disclosure, an amplification circuit includes a first amplifier that receives an external signal and performs first band pass filtering on the external signal to output a first filter signal, and a second amplifier that receives the first filter signal and performs second band pass filtering on the first filter signal to output a second filter signal, and a frequency pass bandwidth of the second band pass filtering is narrower than a frequency pass bandwidth of the first band pass filtering.

According to an embodiment, the first amplifier and the second amplifier may not include an inductor element.

According to an embodiment, the first amplifier may be further configured to amplify the external signal with a first amplification degree to output the first filter signal, the second amplifier may be further configured to amplify the first filter signal with a second amplification degree to output the second filter signal, and the first amplification degree may be greater than the second amplification degree.

According to an embodiment, the first amplifier may include a first input bias circuit that receives the external signal and performs first high pass filtering on the external signal to output a first bias signal and a first amplification stage that receives the first bias signal and performs first low pass filtering on the first bias signal to output the first filter signal, and a cutoff frequency of the first high pass filtering may be less than a cutoff frequency of the first low pass filtering.

According to an embodiment, the first input bias circuit may include an input capacitor connected to a first node and receiving the external signal, a first input resistor connected between a power supply voltage and the first node, and a second input resistor connected between the first node and a ground node.

According to an embodiment, the first amplification stage may include a first amplification resistor connected between the first node and a second node, a second amplification resistor and an amplification capacitor connected in parallel between the second node a third node, and an amplifier having a first input terminal connected to the second node, a second input terminal connected to the ground node, and an output terminal connected to the third node.

According to an embodiment, the first and second input resistors and the first and second amplification resistors may be variable resistors, and the input capacitor and the amplification capacitor may be variable capacitors.

According to an embodiment, the cutoff frequency of the first high pass filtering may be inversely proportional to a capacitance value of the input capacitor.

According to an embodiment, the cutoff frequency of the first low pass filtering may be inversely proportional to a capacitance value of the amplification capacitor.

According to an embodiment, the first amplification degree may be determined based on resistance values of the first amplification resistor and the second amplification resistor.

According to an embodiment of the present disclosure, a human body channel-based wireless communication system including an amplification circuit which receives an external signal and a control circuit that receives the external signal and generates a control signal for controlling the amplification circuit based on a frequency band of the external signal, the amplification circuit includes a first amplifier that receives an external signal and performs first band pass filtering on the external signal to output a first filter signal and a second amplifier that receives the first filter signal and performs second band pass filtering on the first filter signal to output a second filter signal, and a frequency pass bandwidth of the second band pass filtering is narrower than a frequency pass bandwidth of the first band pass filtering.

According to an embodiment, the first amplifier and the second amplifier may not include an inductor element.

According to an embodiment, the first amplifier may be further configured to amplify the external signal with a first amplification degree to output the first filter signal, the second amplifier may be further configured to amplify the first filter signal with a second amplification degree to output the second filter signal, and the first amplification degree may be greater than the second amplification degree.

According to an embodiment, the first amplifier may include a first input bias circuit that receives the external signal and performs first high pass filtering on the external signal to output a first bias signal and a first amplification stage that receives the first bias signal and performs first low pass filtering on the first bias signal to output the first filter signal, and a cutoff frequency of the first high pass filtering may be less than a cutoff frequency of the first low pass filtering.

According to an embodiment, the first input bias circuit may include an input capacitor connected to a first node and receiving the external signal, a first input resistor connected between a power supply voltage and the first node, and a second input resistor connected between the first node and a ground node.

According to an embodiment, the first amplification stage may include a first amplification resistor connected between the first node and a second node, a second amplification resistor and an amplification capacitor connected in parallel between the second node a third node, and an amplifier having a first input terminal connected to the second node, a second input terminal connected to the ground node, and an output terminal connected to the third node.

According to an embodiment, the first and second input resistors and the first and second amplification resistors may be variable resistors, the input capacitor and the amplification capacitor may be variable capacitors, and the frequency pass bandwidth of the first band pass filtering may be adjusted by adjusting resistance values of the variable resistors and capacitance values of the variable capacitors included in the first amplifier based on the control signal.

According to an embodiment of the present disclosure, a method of operating a human body channel-based wireless communication system including an amplification circuit which includes a first amplifier that receives an external signal and performs first band pass filtering on the external signal to output a first filter signal and a second amplifier that receives the first filter signal and performs second band pass filtering on the first filter signal to output a second filter signal, the method includes receiving the external signal, determining a frequency band of the external signal, adjusting a frequency pass bandwidth of the first band pass filtering and a frequency pass bandwidth of the second band pass filtering by adjusting resistance values of variable resistors and capacitance values of variable capacitors included in each of the first amplifier and the second amplifier based on the frequency band of the external signal, generating, by the amplification circuit, the first filter signal based on the external signal, and the first amplifier and the second amplifier do not include an inductor element and the frequency pass bandwidth of the second band pass filtering is narrower than the frequency pass bandwidth of the first band pass filtering.

BRIEF DESCRIPTION OF THE FIGURES

A detailed description of each drawing is provided to facilitate a more thorough understanding of the drawings referenced in the detailed description of the present disclosure.

FIG. 8 is graphs illustrating changes in frequency response characteristics with respect to each amplifier of an on-chip narrowband amplification circuit, according to an embodiment of the present disclosure.

DETAILED DESCRIPTION

Hereinafter, embodiments of the present disclosure will be described clearly and in detail such that those skilled in the art may easily carry out the present disclosure. In the description below, the terms "block", "unit", "module", etc. or components corresponding to the terms may be implemented in the form of software, hardware, or a combination thereof.

In the following drawings or in the detailed description, modules may be connected with any other components except for components illustrated in a drawing or described in the detailed description. Modules or components may be connected directly or indirectly. Modules or components may be connected through communication or may be physically connected.

Figure 1:
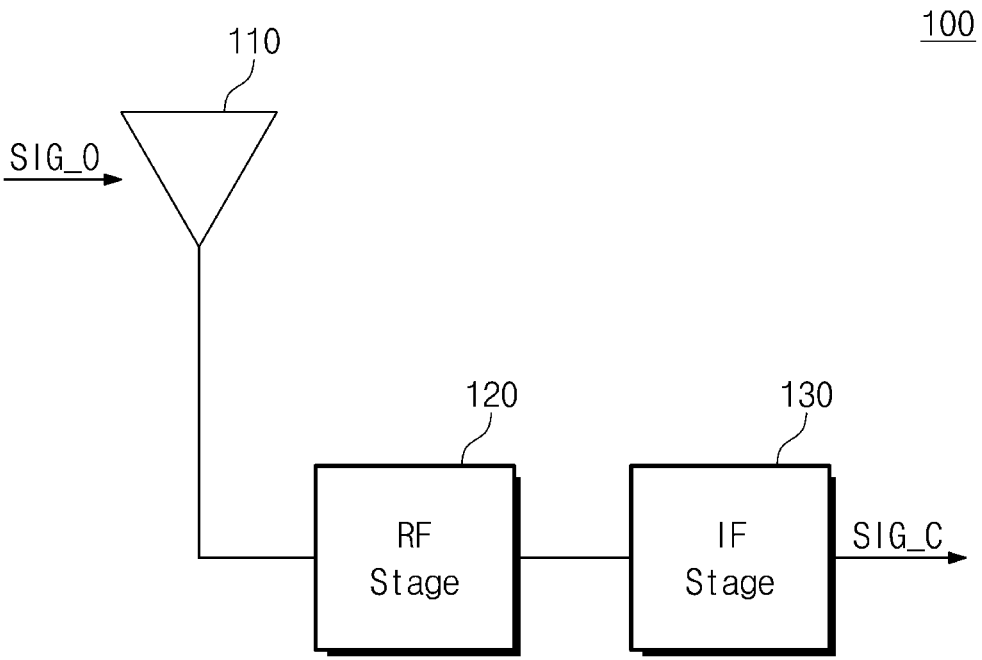
FIG. 1 is a diagram illustrating a reception stage of a wireless communication system, according to a conventional art.

FIG. 1 is a diagram illustrating a reception stage of a wireless communication system, according to a conventional art. Referring to FIG. 1, a reception stage 100 of a general wireless communication system may include an antenna 110, an RF stage 120, and an IF stage 130.

The antenna 110 may receive an external signal SIG_O and may transmit the received signal to the RF stage 120. The received signal may be a radio frequency (RF) signal having a high frequency band.

The RF stage 120 may lower the frequency band of the received RF signal, may modulate it into an intermediate frequency (IF) signal, and may transmit the IF signal to the IF stage 130.

The IF stage 130 may lower the frequency band of the IF signal and may modulate it into a baseband signal. Accordingly, a modulation signal SIG_C may be generated. In this case, the modulation signal SIG_C is a signal of a baseband and may include valid information of the external signal SIG_O.

As described above, the reception stage 100 of FIG. 1 may receive the RF signal, may frequency-convert the RF signal into the baseband signal through the RF stage 120 and the IF stage 130, and may extract the valid information of the external signal SIG_O. In this case, since the external signal SIG_O is an RF signal, it may be relatively less affected by noise in a transmission path. Also, the external signal SIG_O may avoid interference with other signals. Accordingly, a communication system including the RF stage 120 and the IF stage 130 may efficiently perform wireless communication.

5

6

Figure 2:
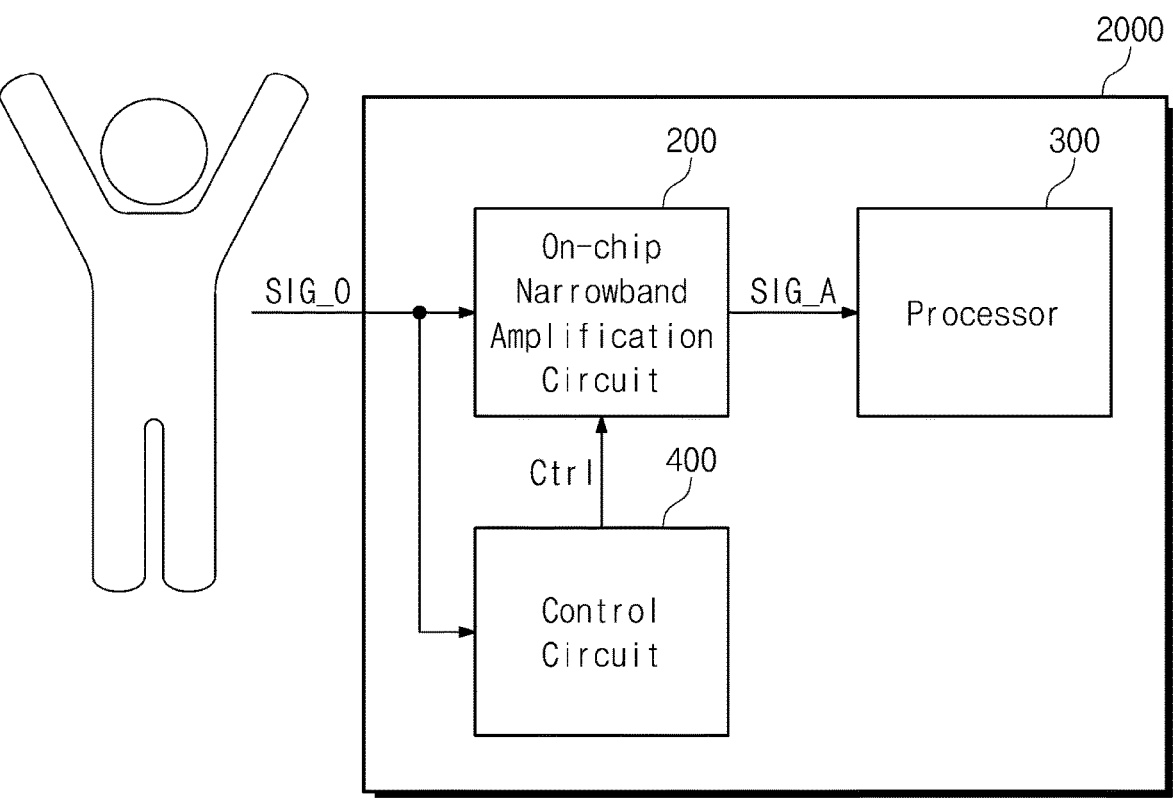
FIG. 2 is a diagram illustrating a human body channel-based wireless communication system, according to an embodiment of the present disclosure.

FIG. 2 is a diagram illustrating a human body channel-based wireless communication system, according to an embodiment of the present disclosure. Referring to FIG. 2, a human body channel-based wireless communication system 2000 may include an on-chip narrowband amplification circuit 200, a processor 300, and a control circuit 400. For example, the on-chip narrowband amplifying circuit 200 may be included in a reception stage of the human body channel-based wireless communication system 2000.

When the human body channel-based wireless communication system 2000 uses high power, there is a risk of harming human body safety. Therefore, in the human body channel-based wireless communication system 2000, low-power circuit implementation is required. In addition, the human body channel-based wireless communication system 2000 may be used for a wearable device or the like. In the wearable device, various devices may coexist in a small space. Therefore, in the human body channel-based wireless communication system 2000, it is required to implement a circuit in a low area.

Unlike the wireless communication system of FIG. 1, to implement a circuit in low power and a low area, the human body channel-based wireless communication system 2000 may not include the antenna 110, the RF stage 120, and the IF stage 130.

Accordingly, the human body channel-based wireless communication system 2000 may directly transmit baseband signals to a human body. Also, the human body channel-based wireless communication system 2000 may receive baseband signals from the human body. In this case, signals transmitted and received by the human body channel-based wireless communication system 2000 may have severe signal attenuation during signal transmission, and noise of various frequencies may be introduced from the outside.

The human body channel-based wireless communication system 2000 may receive the external signal SIG_O from a human body. The external signal SIG_O may be input to the on-chip narrowband amplification circuit 200 and the control circuit 400. In this case, the external signal SIG_O may be a baseband signal.

The on-chip narrowband amplification circuit 200 may filter and amplify the external signal SIG_O to output an amplified signal SIG_A. The processor 300 may receive and process the amplified signal SIG_A. The control circuit 400 may receive the external signal SIG_O and may generate a control signal Ctrl for controlling the on-chip narrowband amplification circuit 200 based on a frequency band of the external signal SIG_O.

Figure 3:
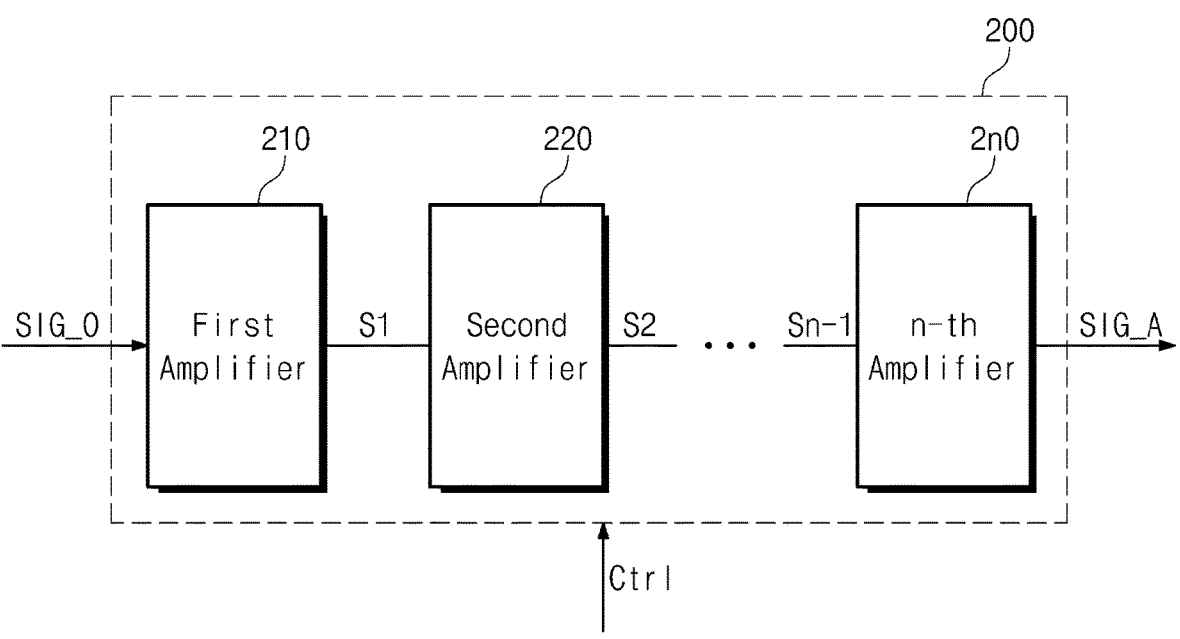
FIG. 3 is a diagram illustrating an on-chip narrowband amplification circuit, according to an embodiment of the present disclosure.

FIG. 3 is a diagram illustrating an on-chip narrowband amplification circuit, according to an embodiment of the present disclosure. Referring to FIGS. 2 and 3, the on-chip narrowband amplification circuit 200 may include first to n-th (where 'n' is an integer greater than or equal to two) amplifiers 210 to $2n0$. The on-chip narrowband amplification circuit 200 may receive the external signal SIG_O, may extract and amplify valid information of the external signal SIG_O, and may output the amplified signal SIG_A.

The first to n-th amplifiers 210 to $2n0$ may be connected in series. Each of the first to n-th amplifiers 210 to $2n0$ may operate as an amplifier having a band pass filter function. For example, the first to n-th amplifiers 210 to $2n0$ may operate as band pass filters having different frequency pass bandwidths (hereinafter referred to as a 'bandwidths'). In detail, the on-chip narrowband amplification circuit 200 according to embodiments of the present disclosure may include the first to n-th amplifiers 210 to $2n0$ of FIG. 3 that are configured as multi-stages.

For example, the first amplifier 210 may band-pass filter the external signal SIG_O to output a first filter signal S1. The first filter signal S1 may be input to the second amplifier 220 connected to the first amplifier 210. The second amplifier 220 may band pass filter the first filter signal S1 to generate a second filter signal S2 and may output it to the connected third amplifier (not illustrated), and the n-th amplifier may band pass filter an n–1 filter signal Sn–1 to generate the amplified signal SIG_A and may output it to the outside. In this case, the amplified signal SIG_A may include valid information of the external signal SIG_O.

In an embodiment, the on-chip narrowband amplification circuit 200 may be configured such that the bandwidth of each of the first to n-th amplifiers $210$-$2n0$ narrows as one moves from the first amplifier 210 located at the input stage to the n-th amplifier $2n0$ located at the output stage. For example, the bandwidth of the second amplifier may be configured to be narrower than the bandwidth of the first amplifier, and the bandwidth of the third amplifier may be configured to be narrower than the bandwidth of the second amplifier.

As the first to n-th amplifiers 210 to $2n0$, which have bandwidths that narrowed according to location, are connected in series, the on-chip narrowband amplification circuit 200 may operate as an amplification circuit having a narrow bandpass filter function.

In addition, the on-chip narrowband amplification circuit 200 may be configured to increase the amplitude of each of the first to n-th amplifiers 210 to $2n0$ as one moves from the first amplifier 210 located at the input stage to the n-th amplifier $2n0$ located at the output stage. For example, the amplification degree of the second amplifier 220 may be configured to be greater than the amplification degree of the first amplifier 210, and the amplification degree of the third amplifier may be configured to be greater than the amplification degree of the second amplifier 220.

As the first to n-th amplifiers 210 to $2n0$ with increasing amplification degrees are connected in series, a signal including valid information and having a small size may be amplified to a level that can be processed by the processor (e.g., 300 of FIG. 2). In addition, when the input signal is small in size, a signal including valid information and noise may be prevented from saturating.

Thus, the human body channel-based wireless communication system 2000 including the on-chip narrowband amplification circuit 200 may perform wireless communication without increasing the power of the transmission signal at a transmission stage. Accordingly, the human body channel-based wireless communication system 2000 may consume less power.

In an embodiment, each of the first to n-th amplifiers 210 to $2n0$ may not include an inductor element that occupies a relatively large area compared to other elements. Accordingly, the on-chip narrowband amplification circuit 200 may be implemented in an on-chip form with a small area. In detail, the on-chip narrowband amplification circuit 200 according to one embodiment of the present disclosure may be utilized to implement the human body channel-based wireless communication system 2000 with low power and a small area.

In an embodiment, the on-chip narrowband amplification circuit 200 may receive the control signal Ctrl from the control circuit 400. The on-chip narrowband amplification circuit 200 may adjust the bandwidth of each of the first to n-th amplifiers 210 to $2n0$ based on the control signal Ctrl. Accordingly, the on-chip narrowband amplification circuit 200 may be implemented to selectively receive an external signal SIG_O that is based on a variable frequency. An operation of adjusting the bandwidth of each of the first to n-th amplifiers 210 to 2n0 will be described in detail below.

Figure 4:
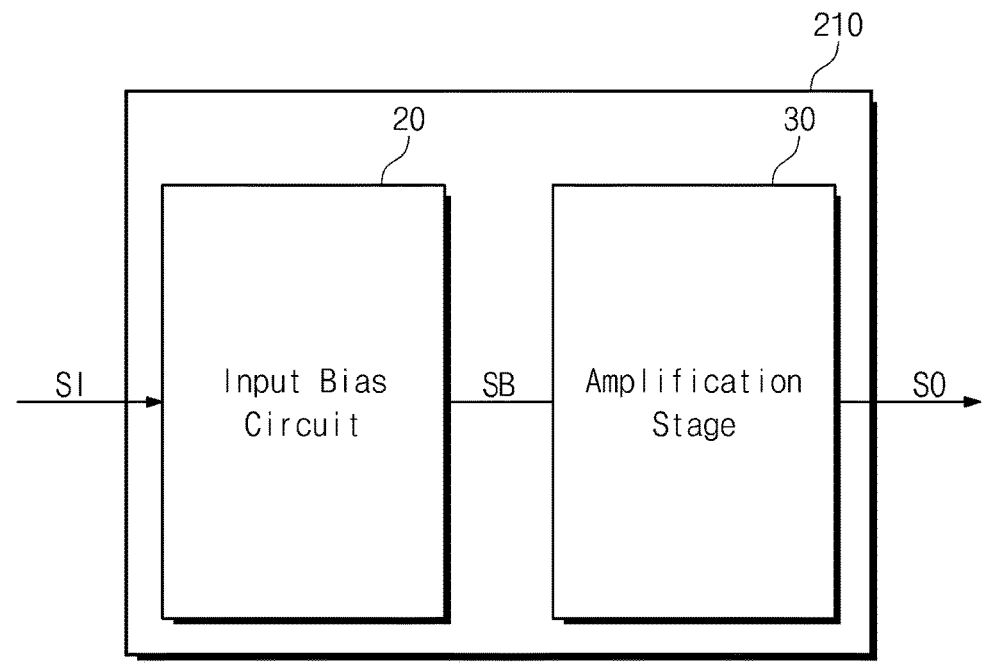
FIG. 4 is a diagram illustrating an example of an amplifier of FIG. 2.

FIG. 4 is a diagram illustrating an example of an amplifier of FIG. 3. Referring to FIGS. 3 and 4, the first amplifier 210 may include an input bias circuit 20 and an amplification stage 30. The input bias circuit 20 and the amplification stage 30 may be connected in series. For convenience of description and brevity of the drawing, FIG. 4 illustrates only the first amplifier 210. However, each of the second to n-th amplifiers 220 to 2n0 may have the same structure as the first amplifier 210.

The input bias circuit 20 may receive an input signal SI. The input bias circuit 20 may have characteristics of a high pass filter. Accordingly, the input bias circuit 20 may amplify only signals of a specific frequency or higher with respect to the input signal SI, and may remove signals of the specific frequency or lower.

The input bias circuit 20 may generate a bias signal SB by high pass filtering the input signal SI. The bias signal SB may be input to the amplification stage 30 connected to the input bias circuit 20. For example, the input bias circuit 20 of the first amplifier 210 may receive the external signal SIG_O as the input signal SI.

The amplification stage 30 may receive the bias signal SB from the input bias circuit 20. The amplification stage 30 may have characteristics of a low pass filter and may amplify the bias signal SB. Accordingly, the amplification stage 30 may generate an output signal SO by amplifying only signals having a specific frequency or less and removing signals having a specific frequency or more with respect to the bias signal SB.

For example, the output signal SO generated by the amplification stage 30 included in the first amplifier 210 may be the first filter signal S1. The first filter signal S1 may be input to the input bias circuit 20 of the second amplifier 220 connected in series with the amplification stage 30 of the first amplifier 210. In detail, the input bias circuit 20 of the second amplifier 220 may receive the first filter signal S1 as the input signal SI.

The input bias circuit 20 of the second amplifier 220 may generate the bias signal SB based on the first filter signal S1. The amplification stage 30 of the second amplifier 220 may generate the output signal SO based on the bias signal SB generated by the input bias circuit 20 of the second amplifier 220. In this case, the output signal SO may be the second filter signal S2. The input bias circuit of the n-th amplifier 2n0 may receive an (n−1)-th filter signal Sn−1 as the input signal SI and may generate the bias signal SB. The amplification stage 30 of the n-th amplifier 2n0 may generate the output signal SO based on the bias signal SB generated by the input bias circuit of the n-th amplifier 2n0. In this case, the output signal SO may be the amplified signal SIG_A, and the on-chip narrowband amplification circuit 200 may output the amplified signal SIG_A to the outside.

In detail, each of the first to n-th amplifiers 210 to 2n0 may be configured by serially connecting the input bias circuit 20 having high pass filter characteristics and the amplification stage 30 having low pass filter characteristics. For example, the cutoff frequency of the amplification stage 30 included in the first amplifier 210 may be configured higher than the cutoff frequency of the input bias circuit 20 included in the first amplifier 210. Accordingly, each of the first to n-th amplifiers 210 to 2n0 may operate with band pass filter characteristics.

Figure 5A:
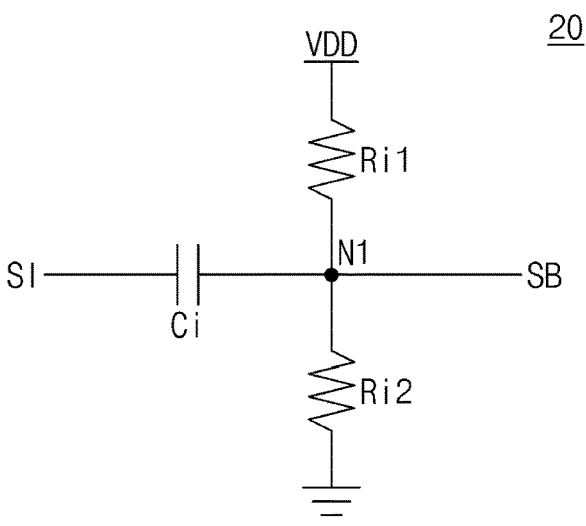
FIG. 5A is a circuit diagram illustrating an example of an input bias circuit of FIG. 3.
Figure 5B:
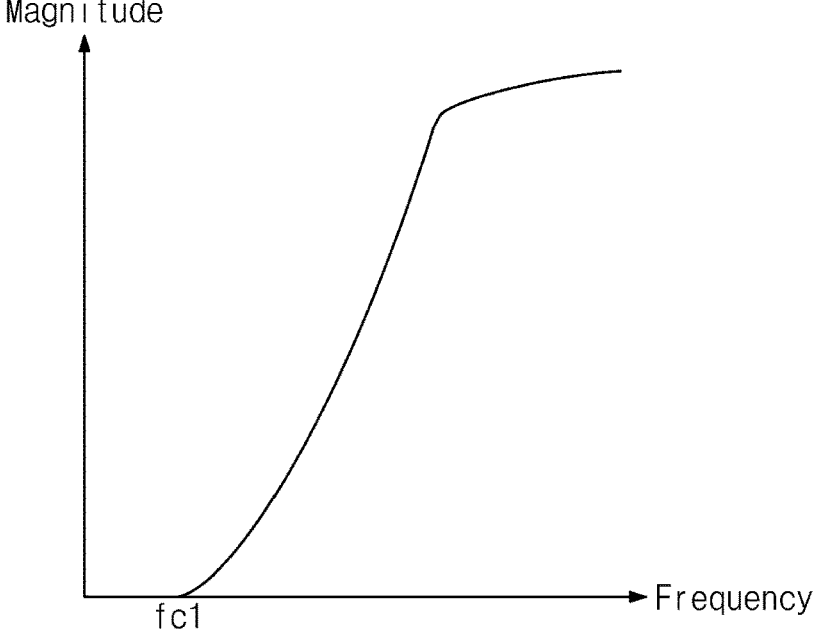
FIG. 5B is a graph illustrating frequency response characteristics of an input bias circuit of FIG. 5A.

FIG. 5A is a circuit diagram illustrating an example of an input bias circuit of FIG. 4, and FIG. 5B is a graph illustrating frequency response characteristics of an input bias circuit of FIG. 5A. In a graph of FIG. 5B, a horizontal axis represents a frequency, and a vertical axis represents a magnitude of a signal. FIG. 5A will be described with reference to FIGS. 3 to 4.

Referring to FIG. 5A, the input bias circuit 20 of FIG. 4 may include an input capacitor Ci, a first input resistor Ri1, and a second input resistor Ri2. As described above, the input bias circuits included in the second to n-th amplifiers 220 to 2n0 of FIG. 3 may have the same structure as the input bias circuit 20 illustrated in FIG. 5A.

One terminal of the input capacitor Ci may be connected to a first node N1, and the input signal SI may be input to the other terminal of the input capacitor Ci. Accordingly, the input capacitor Ci may remove a direct current (DC) component of the input signal SI. In an embodiment, the input capacitor Ci may be a variable capacitor.

For example, the input capacitor Ci of the input bias circuit 20 included in the first amplifier 220 may receive the external signal SIG_O as the input signal SI. The input capacitor Ci of the input bias circuit 20 included in the second amplifier 220 may receive the first filter signal S1 output by the first amplifier 210 as the input signal SI.

The first input resistor Ri1 may be connected between a power supply voltage VDD and the first node N1. The second input resistor Ri2 may be connected between the first node N1 and a ground node. The first input resistor Ri1 and the second input resistor Ri2 may be configured as a voltage divider bias circuit. Accordingly, the input bias circuit 20 may adjust a DC bias voltage of the input signal SI.

In an embodiment, the first input resistor Ri1 and the second input resistor Ri2 may be variable resistors.

The input bias circuit 20 may operate as a high pass filter by the input capacitor Ci, the first input resistor Ri1 and the second input resistor Ri2. Referring to FIG. 5B, the input bias circuit 20 may extract only signals having a frequency greater than or equal to a cutoff frequency fc1 to output the bias signal SB. For example, the cutoff frequency fc1 of the input bias circuit 20 may be in inverse proportion to the size of the input capacitor Ci.

As described above, the input bias circuit 20 may not include an inductor element that is relatively large in size compared to a capacitor and resistor. Accordingly, the on-chip narrowband amplification circuit of FIG. 3 may be implemented to have a small area.

In one embodiment, the input bias circuit 20 may be implemented as a differential structure, unlike that shown in FIG. 5A. The input bias circuit 20 may be implemented in various structures for generating a bias signal SB by high pass filtering the input signal SI.

Figure 6A:
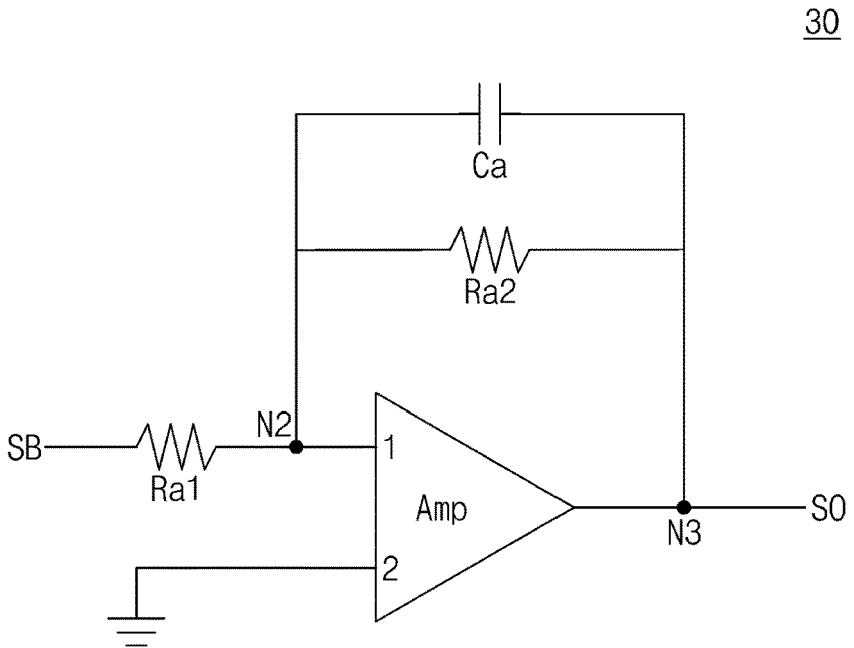
FIG. 6A is a circuit diagram illustrating an example of an amplification stage of FIG. 3.
Figure 6B:
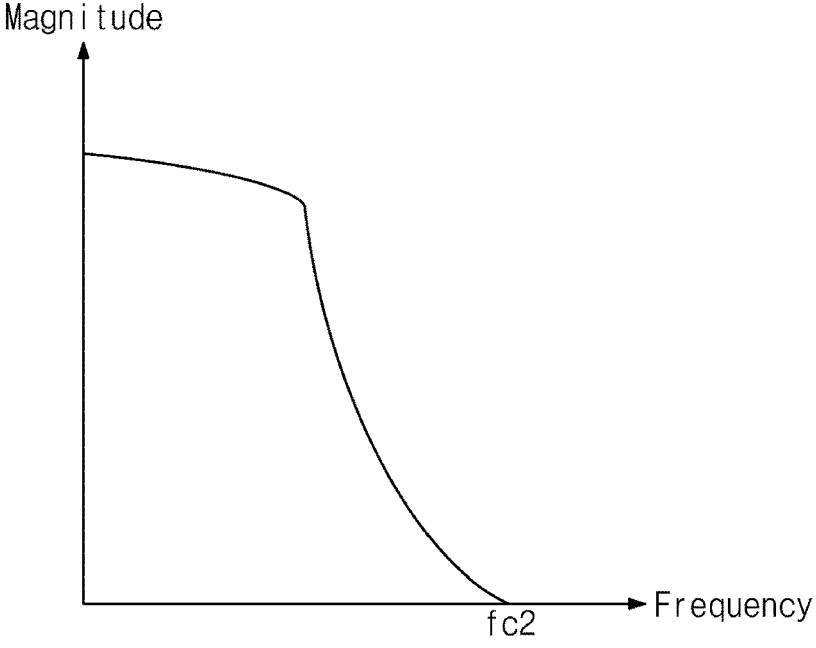
FIG. 6B is a graph illustrating frequency response characteristics of an amplification stage of FIG. 6A.

FIG. 6A is a circuit diagram illustrating an example of an amplification stage of FIG. 4, and FIG. 6B is a graph illustrating frequency response characteristics of an amplification stage of FIG. 6A. In a graph of FIG. 6B, a horizontal axis represents a frequency, and a vertical axis represents a magnitude of a signal. FIG. 6A will be described with reference to FIGS. 3 to 4.

Referring to FIG. 6A, the amplification stage 30 may include a first amplification resistor Ra1, a second amplification resistor Ra2, an amplification capacitor Ca, and an amplifier AMP. As described above, the amplification stages included in the second to n-th amplifiers 220 to 2n0 of FIG. 3 may have the same structure as the amplification stage 30 illustrated in FIG. 6A.

The first amplification resistor Ra1 may be connected between the first node N1 of the input bias circuit 20 and a second node N2 of the amplification stage 30. Accordingly, the bias signal SB generated by the input bias circuit 20 may be input to the amplification stage 30.

The second amplification resistor Ra2 and the amplification capacitor Ca may be connected in parallel between the second node N2 and a third node N3.

In an embodiment, the first amplification resistor Ra1 and the second amplification resistor Ra2 may be variable resistors, and the amplification capacitor Ca may be a variable capacitor.

The amplifier AMP may be a differential amplifier having a first input terminal '1' and a second input terminal '2'. The first input terminal '1' may be connected to the second node N2. The second input terminal '2' may be connected to a ground node. An output terminal of the amplifier AMP may be connected to the third node N3.

The amplification stage 30 may operate as a low pass filter by the first amplification resistor Ra1, the second amplification resistor Ra2, the amplification capacitor Ca, and the amplifier AMP. Referring to FIG. 6B, the amplification stage 30 may extract and amplify only signals having a frequency equal to or less than a cutoff frequency fc2. In detail, the amplification stage 30 may low-pass filter and amplify the bias signal SB to generate the output signal SO.

For example, the output signal SO generated by the amplification stage 30 of the first amplifier 210 may be the first filter signal S1, the output signal SO generated by the amplification stage 30 of the second amplifier 220 may be the second filter signal S2, and the output signal SO generated by the amplification stage 30 of the n-th amplifier 2n0 may be the amplified signal SIG_A.

For example, the cutoff frequency fc2 of the amplification stage 30 may be in inverse proportion to a size of the amplification capacitor Ca. In addition, the amplification degree of the amplification stage 30 may be determined based on the sizes of the first amplification resistor Ra1 and the second amplification resistor Ra2.

For example, the third node N3 of the amplification stage 30 of the first amplifier 210 may be connected to one terminal of the input capacitor Ci included in the input bias circuit 20 of the second amplifier 220. Accordingly, the first filter signal S1 may be input to the one terminal of the input capacitor Ci included in the input bias circuit 20 of the second amplifier 220. The second filter signal S2 generated by the second amplifier 220 may be input to the one terminal of the input capacitor Ci included in the input bias circuit 20 of the third amplifier 230.

As already described above, the amplification stage 30 may not include an inductor element that is relatively large in size compared to the capacitor and resistor. Accordingly, the on-chip narrowband amplifier circuit of FIG. 3 may be implemented to have a small area.

For example, the amplifier AMP included in the amplification stage 30 of each of the first to n-th amplifiers 210 to 2n0 may be a differential amplifier. In this case, the output signal SO generated by the amplification stage 30 may include a minute DC voltage (for example, it may be referred to as a DC bias gap) due to process mismatch. For example, the output signal SO of the first amplifier is the first filter signal S1 and may include the DC bias gap.

For example, when each of the first to n-th amplifiers 210 to 2n0 does not include the input bias circuit 20, the DC bias gap included in the first filter signal S1 generated by the first amplifier 210 may be amplified by the amplification stage 30 of the second to n-th amplifiers 220 to 2n0 at a rear stage. Accordingly, a large DC bias gap may be formed at the output terminal of the on-chip narrowband amplification circuit 200. The DC bias gap formed at the output stage may affect the operation of the on-chip narrowband amplification circuit 200 that needs to amplify the input signal having a very low level.

Accordingly, the on-chip narrowband amplification circuit 200 may not operate normally, and may not be possible to generate the amplified signal SIG_A by extracting valid information of the external signal SIG_O.

As already described above, in the on-chip narrowband amplification circuit 200 according to the present disclosure, the input bias circuit 20 is inserted in front of the amplification stage 30 of each of the first to n-th amplifiers 210 to 2n0.

Accordingly, for example, the input bias circuit 20 of the second amplifier 220 may remove the DC bias gap included in the first filter signal S1 and generated by the amplification stage 30 of the first amplifier 210. In detail, as each of the first to n-th amplifiers 210 to 2n0 includes the input bias circuit, the DC bias gap generated by the process mismatch may not affect the operation of the on-chip narrowband amplification circuit 200.

For example, the amplification stage 30 may be implemented with a structure different from that shown in FIG. 6A to generate the output signal SO by performing low pass filtering and amplification of the bias signal SB.

Figure 7:
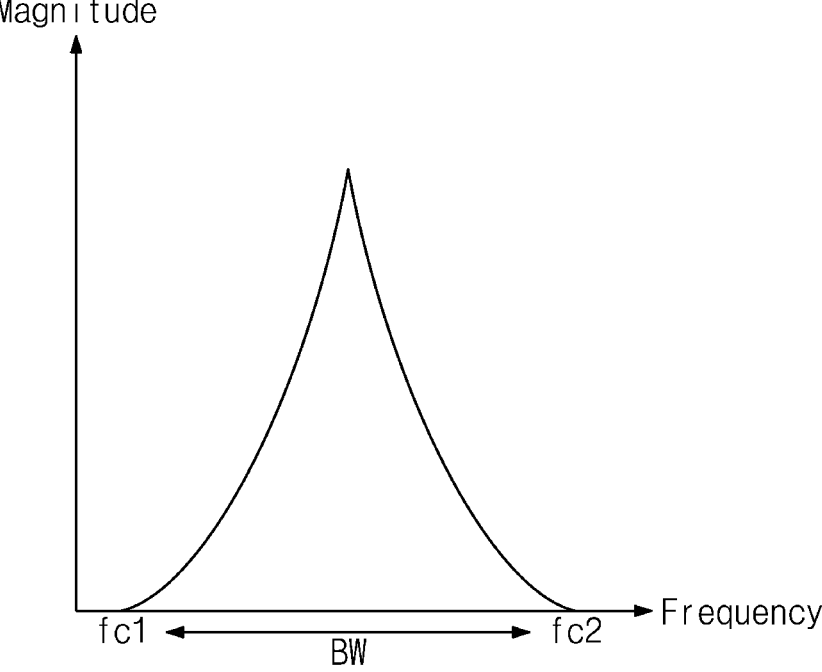
FIG. 7 is a graph illustrating frequency response characteristics of an amplifier, according to an embodiment of the present disclosure.

FIG. 7 is a graph illustrating frequency response characteristics of an amplification stage of FIG. 4. The cutoff frequency fc1 of the input bias circuit 20 having a high pass filter characteristic may be less than the cutoff frequency fc2 of the amplification stage 30 having a low pass filter characteristic.

In detail, each of the first to n-th amplifiers 210 to 2n0 may have a band pass filter characteristic having a bandwidth BW of a value obtained by subtracting the cutoff frequency fc1 of the input bias circuit (e.g., 211) from the cutoff frequency fc2 of the amplification stage (e.g., 212).

In an embodiment, the first input resistor Ri1 and the second input resistor Ri2 of the input bias circuit 20 and the first amplification resistor Ra1 and the second amplification resistor Ra2 of the amplification stage 30 may be variable resistors. In addition, the input capacitor Ci of the input bias circuit 20 and the amplification capacitor Ca of the amplification stage 30 may be variable capacitors.

In this case, the resistance values of the resistors Ri1 to Ri2 and Ra1 to Ra2 of each of the first to n-th amplifiers 210 to 2n0 and the capacitance values of the input capacitor Ci and the amplification capacitor Ca may be adjusted. Accordingly, the bandwidth BW of each of the amplifiers 210 to 2n0 may be adjusted. Accordingly, the on-chip narrowband amplification circuit 200 may selectively receive signals transmitted based on a variable frequency.

For example, the human body channel-based wireless communication system 2000 of FIG. 2 may receive a wake-up signal of a low frequency band as the external signal SIG_O. The control circuit 400 may determine the frequency band of the external signal SIG_O and may generate the control signal Ctrl for adjusting the bandwidth of each of a plurality of amplifiers included in the on-chip narrowband amplification circuit 200. The on-chip narrowband amplification circuit 200 may adjust capacitance values and resistance values of elements included in each of the plurality of amplifiers 210 to 2n0 based on the control signal Ctrl. Accordingly, the on-chip narrowband amplification circuit 200 may receive a wake-up signal based on a low frequency band.

Thereafter, the human body channel-based wireless communication system 2000 may re-adjust capacitance values and resistance values of elements included in each of the plurality of amplifiers 210 to 2n0 included in the on-chip narrowband amplification circuit 200. Accordingly, the on-chip narrowband amplification circuit 200 may receive the remaining signals based on the human body communication band.

Figure 8:
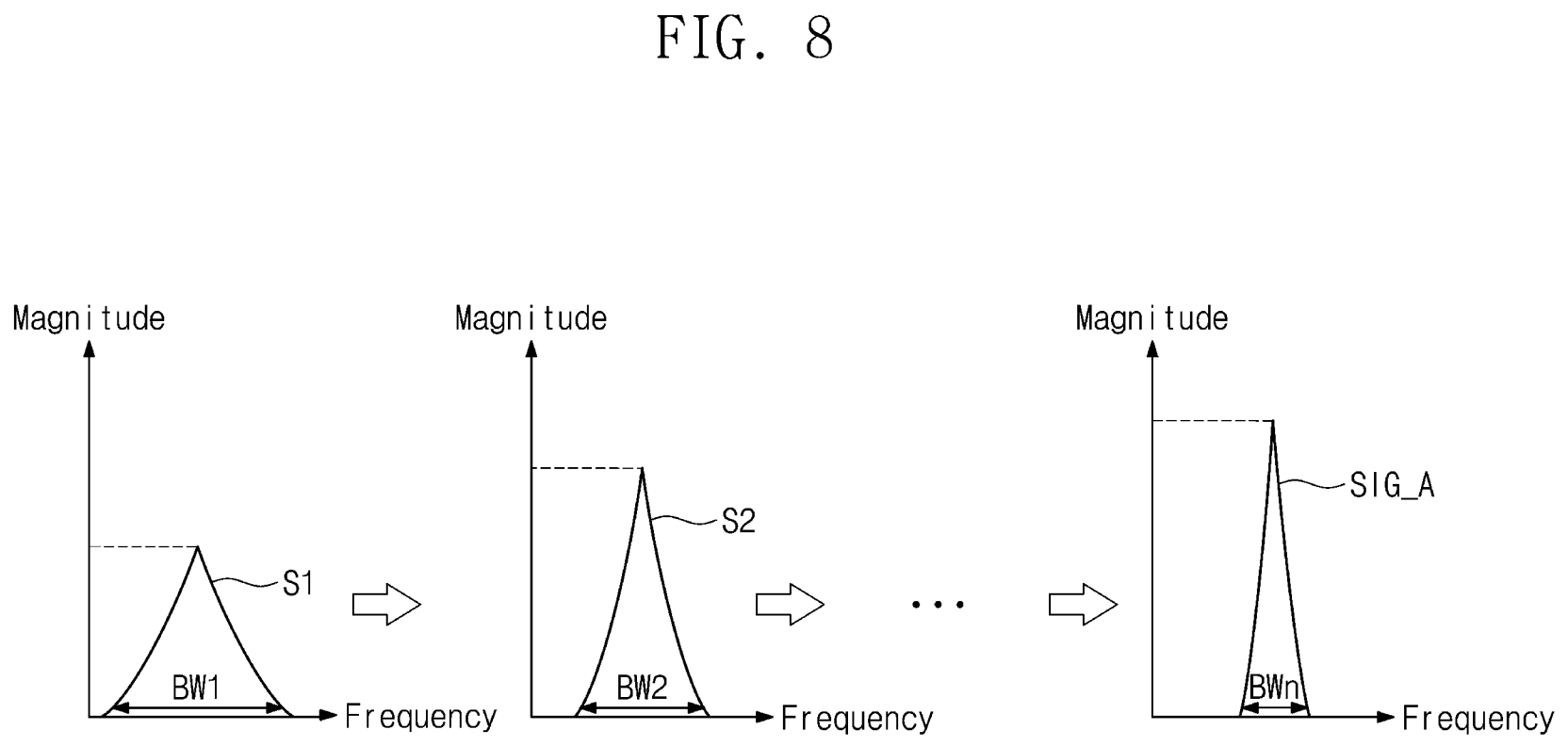

FIG. 8 is graphs illustrating changes in frequency response characteristics with respect to each amplifier of an on-chip narrowband amplification circuit, according to an embodiment of the present disclosure. In the graph of FIG. 8, a horizontal axis represents a frequency, and a vertical axis represents a magnitude of a signal.

Referring to FIGS. 3, 4 and 8, the first amplifier 210 may operate as an amplifier having a band pass filter characteristic of a first bandwidth BW1. Accordingly, the first amplifier 210 may generate the first filter signal S1 by amplifying only signals within the range of the first bandwidth BW1 of the external signal SIG_O. The second amplifier 220 may operate as an amplifier having a band pass filter characteristic of the second bandwidth BW2. Accordingly, the second amplifier 220 may generate the second filter signal S2 by amplifying only signals within the range of the second bandwidth BW2 of the first filter signal S1. The n-th amplifier 2n0 may operate as an amplifier having a band pass filter characteristic of an n-th bandwidth BWN. Accordingly, the n-th amplifier 2n0 may generate the amplified signal SIG_A by amplifying only signals within the range of the n-th bandwidth BWn of an (n−1)-th signal (not illustrated).

For example, when the first bandwidth BW1 is set too narrowly, a signal including valid information may be removed from the external signal SIG_O. In addition, when the amplification degree of the first amplifier 210 is set too high, a signal (e.g., noise) that does not include valid information in the external signal SIG_O may be excessively amplified. Accordingly, the on-chip narrowband amplification circuit 200 may not be able to correctly extract a signal including valid information from the external signal SIG_O.

Therefore, the on-chip narrowband amplification circuit 200 according to the present disclosure may be configured to have a narrow bandwidth and a degree of low amplification with respect to the amplifiers located at the first stage among the plurality of amplifiers 210 to 2n0 connected in series, and may be configured to have a wide bandwidth and a high amplification degree as it moves to the amplifiers located at a later stage.

For example, the first bandwidth BW1 may be set to be narrower than the second bandwidth BW2, and the n-th bandwidth BWn may be set to be narrower than an (n−1)-th bandwidth (not illustrated). In addition, the amplification degree of the first amplifier 210 may be set lower than that of the second amplifier 220, and the amplification degree of the (n−1)-th amplifier (not illustrated) may be set lower than that of the n-th amplifier 2n0.

Accordingly, the on-chip narrowband amplification circuit 200 according to the present disclosure may operate as a narrowband band pass filter, may operate as an amplification circuit that is insensitive to external noise, and may maximize the magnitude of amplification with respect to the signal including valid information.

Figure 9:
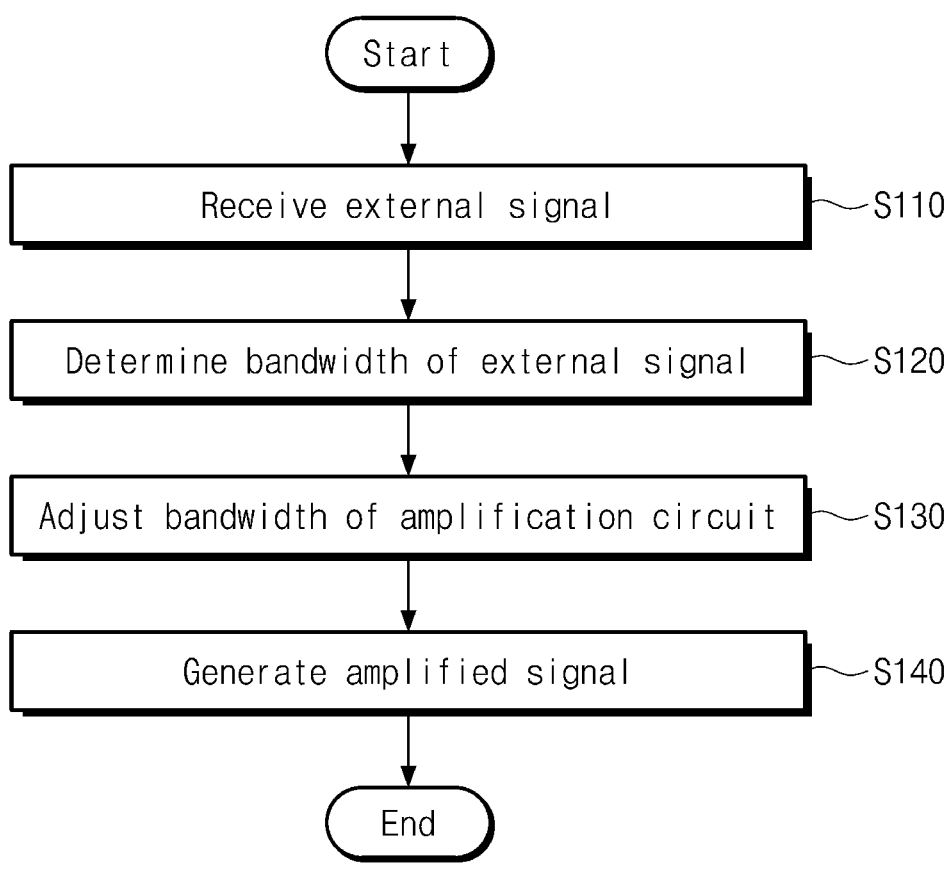
FIG. 9 is a flowchart illustrating a method of operating a human body channel-based wireless communication system including an on-chip narrowband amplification circuit, according to an embodiment of the present disclosure.

FIG. 9 is a flowchart illustrating a method of operating a human body channel-based wireless communication system including an on-chip narrowband amplification circuit, according to an embodiment of the present disclosure.

Referring to FIGS. 2, 3, 4, and 9, in operation S110, the human body channel-based wireless communication system 2000 may receive the external signal SIG_O.

In operation S120, the human body channel-based wireless communication system 2000 may determine the frequency bandwidth of the external signal SIG_O.

In operation S130, the human body channel-based wireless communication system 2000 may adjust resistance values and capacitance values of the input bias circuit 20 and the amplification stage 30 included in each of the amplifiers 210 to 2n0 of the on-chip narrowband amplification circuit 200 based on the frequency bandwidth of the external signal SIG_O.

In operation S140, the human body channel-based wireless communication system 2000 may input the external signal SIG_O to the on-chip narrowband amplification circuit 200. In addition, the on-chip narrowband amplification circuit 200 may generate the amplified signal SIG_A by extracting valid information of the input external signal SIG_O.

According to an embodiment of the present disclosure, it is possible to implement an amplification circuit having narrowband band pass filter characteristics without having an inductor. Accordingly, an amplification circuit having a low-power and low-area, a human body channel-based wireless communication system including the same, and an operation method thereof are provided.

The above descriptions are specific embodiments for carrying out the present disclosure. Embodiments in which a design is changed simply or which are easily changed may be included in the present disclosure as well as an embodiment described above. In addition, technologies that are easily changed and implemented by using the above embodiments may be included in the present disclosure. Therefore, the scope of the present disclosure should not be limited to the above-described embodiments, and should be defined by the claims described below as well as the claims and equivalents of the present disclosure.

What is claimed is:

1. An amplification circuit comprising:
a first amplifier of two or more amplifiers configured to receive an external signal, and to perform first band pass filtering on the external signal to output a first filter signal; and
a second amplifier of two or more amplifiers configured to receive the first filter signal, and to perform second band pass filtering on the first filter signal to output a second filter signal, and
wherein a frequency pass bandwidth of the second band pass filtering is narrower than a frequency pass bandwidth of the first band pass filtering.

2. The amplification circuit of claim 1, wherein the first amplifier and the second amplifier do not include an inductor element.

3. The amplification circuit of claim 2, wherein the first amplifier is further configured to amplify the external signal with a first amplification degree to output the first filter signal, and the second amplifier is further configured to amplify the first filter signal with a second amplification degree to output the second filter signal, and
wherein the second amplification degree is greater than the first amplification degree.

4. The amplification circuit of claim 3, wherein the first amplifier includes:
a first input bias circuit configured to receive the external signal, and to perform first high pass filtering on the external signal to output a first bias signal; and
a first amplification stage configured to receive the first bias signal, and to perform first low pass filtering on the first bias signal to output the first filter signal, and wherein a cutoff frequency of the first high pass filtering is less than a cutoff frequency of the first low pass filtering.

5. The amplification circuit of claim 4, wherein the first input bias circuit includes:

an input capacitor connected to a first node and receiving the external signal;

a first input resistor connected between a power supply voltage and the first node; and a second input resistor connected between the first node and a ground node.

6. The amplification circuit of claim 5, wherein the first amplification stage includes:

a first amplification resistor connected between the first node and a second node;

a second amplification resistor and an amplification capacitor connected in parallel between the second node a third node; and an amplifier having a first input terminal connected to the second node, a second input terminal connected to the ground node, and an output terminal connected to the third node.

7. The amplification circuit of claim 6, wherein the first and second input resistors and the first and second amplification resistors are variable resistors, and wherein the input capacitor and the amplification capacitor are variable capacitors.

8. The amplification circuit of claim 7, wherein the cutoff frequency of the first high pass filtering is inversely proportional to a capacitance value of the input capacitor.

9. The amplification circuit of claim 8, wherein the cutoff frequency of the first low pass filtering is inversely proportional to a capacitance value of the amplification capacitor.

10. The amplification circuit of claim 9, wherein the first amplification degree is determined based on resistance values of the first amplification resistor and the second amplification resistor.

11. A human body channel-based wireless communication system comprising an amplification circuit which receives an external signal; and a control circuit configured to receive the external signal and to generate a control signal for controlling the amplification circuit based on a frequency band of the external signal, wherein the amplification circuit includes:

a first amplifier of two or more amplifiers configured to receive an external signal, and to perform first band pass filtering on the external signal to output a first filter signal; and a second amplifier of two or more amplifiers configured to receive the first filter signal, and to perform second band pass filtering on the first filter signal to output a second filter signal, and wherein a frequency pass bandwidth of the second band pass filtering is narrower than a frequency pass bandwidth of the first band pass filtering.

12. The wireless communication system of claim 11, wherein the first amplifier and the second amplifier do not include an inductor element.

13. The wireless communication system of claim 12, wherein the first amplifier is further configured to amplify the external signal with a first amplification degree to output the first filter signal, and the second amplifier is further configured to amplify the first filter signal with a second amplification degree to output the second filter signal, and wherein the second amplification degree is greater than the first amplification degree.

14. The wireless communication system of claim 13, wherein the first amplifier includes:

a first input bias circuit configured to receive the external signal, and to perform first high pass filtering on the external signal to output a first bias signal; and a first amplification stage configured to receive the first bias signal, and to perform first low pass filtering on the first bias signal to output the first filter signal, and wherein a cutoff frequency of the first high pass filtering is less than a cutoff frequency of the first low pass filtering.

15. The wireless communication system of claim 14, wherein the first input bias circuit includes:

an input capacitor connected to a first node and receiving the external signal;

a first input resistor connected between a power supply voltage and the first node; and a second input resistor connected between the first node and a ground node.

16. The wireless communication system of claim 15, wherein the first amplification stage includes:

a first amplification resistor connected between the first node and a second node;

a second amplification resistor and an amplification capacitor connected in parallel between the second node a third node; and an amplifier having a first input terminal connected to the second node, a second input terminal connected to the ground node, and an output terminal connected to the third node.

17. The wireless communication system of claim 16, wherein the first and second input resistors and the first and second amplification resistors are variable resistors, and the input capacitor and the amplification capacitor are variable capacitors, and wherein the frequency pass bandwidth of the first band pass filtering is adjusted by adjusting resistance values of the variable resistors and capacitance values of the variable capacitors included in the first amplifier based on the control signal.

18. A method of operating a human body channel-based wireless communication system including an amplification circuit which includes a first amplifier of two or more amplifiers configured to receive an external signal and to perform first band pass filtering on the external signal to output a first filter signal and a second amplifier of two or more amplifiers configured to receive the first filter signal and to perform second band pass filtering on the first filter signal to output a second filter signal, the method comprising:

receiving the external signal;

determining a frequency band of the external signal;

adjusting a frequency pass bandwidth of the first band pass filtering and a frequency pass bandwidth of the second band pass filtering by adjusting resistance values of variable resistors and capacitance values of variable capacitors included in each of the first amplifier and the second amplifier based on the frequency band of the external signal; and generating, an amplified signal based on the first filter signal, the second filter signal and the external signal, and wherein the first amplifier and the second amplifier do not include an inductor element, and the frequency pass bandwidth of the second band pass filtering is narrower than the frequency pass bandwidth of the first band pass filtering.

\* \* \* \* \*